United States Patent
Enichlmair et al.

(10) Patent No.: US 10,084,004 B2
(45) Date of Patent: Sep. 25, 2018

(54) SEMICONDUCTOR DEVICE FOR OPTICAL APPLICATIONS AND METHOD OF PRODUCING SUCH A SEMICONDUCTOR DEVICE

(71) Applicant: ams AG, Unterpremstaetten (AT)

(72) Inventors: Hubert Enichlmair, Weinitzen (AT); Franz Schrank, Graz (AT)

(73) Assignee: AMS AG, Unterpremstaetten (AT)

( * ) Notice: Subject to any disclaimer, the term of this patent is extended or adjusted under 35 U.S.C. 154(b) by 218 days.

(21) Appl. No.: 15/114,387

(22) PCT Filed: Jan. 14, 2015

(86) PCT No.: PCT/EP2015/050587
§ 371 (c)(1),
(2) Date: Jul. 26, 2016

(87) PCT Pub. No.: WO2015/110332
PCT Pub. Date: Jul. 30, 2015

(65) Prior Publication Data
US 2016/0343757 A1    Nov. 24, 2016

(30) Foreign Application Priority Data
Jan. 27, 2014   (EP) .................................... 14152688

(51) Int. Cl.
*H01L 31/0232*   (2014.01)
*H01L 27/146*    (2006.01)
*H01L 23/48*     (2006.01)

(52) U.S. Cl.
CPC ...... *H01L 27/14625* (2013.01); *H01L 23/481* (2013.01); *H01L 27/14632* (2013.01); *H01L 27/14636* (2013.01); *H01L 27/14687* (2013.01)

(58) Field of Classification Search
CPC ......... H01L 31/02002; H01L 31/02016; H01L 31/0224; H01L 27/14636; H01L 27/14632; H01L 27/14687; H01L 27/14665–27/14676; H01L 27/14625–27/14629
USPC ...................................... 438/27, 29; 257/432
See application file for complete search history.

(56) References Cited

U.S. PATENT DOCUMENTS

| 8,378,496 B2 | 2/2013 | Schrank et al. |
| 9,324,756 B2 * | 4/2016 | Yu ..................... H01L 21/76898 |
| 2005/0173064 A1 | 8/2005 | Miyanari |
| 2006/0035415 A1 | 2/2006 | Wood et al. |

(Continued)

FOREIGN PATENT DOCUMENTS

| DE | 10156465 C1 | 7/2003 |
| DE | 102009004725 A1 | 7/2010 |

(Continued)

*Primary Examiner* — Kevin M Picardat
(74) *Attorney, Agent, or Firm* — McDermott Will & Emery LLP

(57) ABSTRACT

A sensor (2) is arranged at a main surface (10) of a semiconductor substrate (1), and a filter (3) is arranged above the sensor. A through-substrate via (4) penetrates the substrate outside the region of the sensor. A semiconductor body is applied above the main surface and then partially removed at least in an area above the sensor. A portion of the semiconductor body remains above the through-substrate via as a frame layer (5). The filter is on a level with the frame layer.

7 Claims, 6 Drawing Sheets

(56) References Cited

U.S. PATENT DOCUMENTS

| | | |
|---|---|---|
| 2007/0249095 A1 | 10/2007 | Song et al. |
| 2008/0237766 A1* | 10/2008 | Kim .................. H01L 27/14627 |
| | | 257/432 |
| 2009/0218560 A1 | 9/2009 | Flaim et al. |
| 2010/0327383 A1* | 12/2010 | Hayasaki .......... H01L 21/76898 |
| | | 257/432 |
| 2011/0001205 A1* | 1/2011 | Sul .................... H01L 27/14621 |
| | | 257/432 |
| 2011/0221018 A1 | 9/2011 | Shi et al. |
| 2012/0091515 A1 | 4/2012 | Yoo et al. |
| 2012/0286430 A1 | 11/2012 | Kraft et al. |
| 2015/0035103 A1* | 2/2015 | Inoue ................. H01L 27/1464 |
| | | 257/432 |

FOREIGN PATENT DOCUMENTS

| | | |
|---|---|---|
| EP | 2306506 B1 | 7/2013 |
| WO | 2010/006916 A1 | 1/2010 |
| WO | 2011/039167 A1 | 4/2011 |
| WO | 2013056936 A1 | 4/2013 |

* cited by examiner

SEMICONDUCTOR DEVICE FOR OPTICAL APPLICATIONS AND METHOD OF PRODUCING SUCH A SEMICONDUCTOR DEVICE

BACKGROUND OF THE INVENTION

US 2007/249095 A1 discloses a semiconductor package including an infrared filter bonded to a wafer. A suitable infrared filter layer is applied on a glass sheet having the same dimensions as the wafer. The glass sheet is bonded to the wafer with the filter layer facing towards the wafer, which is subsequently thinned. The resulting total thickness of the wafer and the filter is not greater than the initial thickness of the wafer. Via holes are formed through the wafer from the side opposite the filter to contact pad electrodes that are located between the wafer and the filter.

DE 102009004725 A1 describes stacked semiconductor devices with a bond layer including a buried contact pad, which is connected with a metal layer on the upper surface of one of the wafers by means of a metallization in a through-wafer via. The contact pad and the surface metal layer can be connected with a metal plane of a wiring or with a contact pad that is provided for a connection with a further semiconductor device.

The formation of through-silicon vias in a semiconductor substrate is described in U.S. Pat. No. 8,378,496 B2, WO 2010/006916 A1 and WO 2011/039167 A1.

Production methods using temporary bonding are described in US 2005/0173064 A1, US 2009/0218560 A1, DE 10156465 C1 and WO 2013/056936 A1.

SUMMARY OF THE INVENTION

The semiconductor device comprises a semiconductor substrate with a main surface, a sensor arranged in the substrate at the main surface, a filter arranged above the sensor, and a through-substrate via penetrating the substrate outside the sensor. A frame layer is arranged above the main surface above the through-substrate via. The frame layer does not cover the filter, which is on a level with the frame layer.

In particular, the frame layer may be a silicon layer. The sensor may be an optical sensor, and the filter may be an optical filter, especially an interference filter, which may especially be used as an ultraviolet and/or infrared cut-off filter, a photopic filter, a color filter, a band pass filter or any combination thereof.

Further embodiments comprise a dielectric layer on the main surface, the filter and the frame layer being arranged on the dielectric layer.

Further embodiments comprise a metal layer arranged in the dielectric layer, a contact area of the metal layer between the through-substrate via and the frame layer, and a metal layer of the through-substrate via contacting the contact area.

Further embodiments comprise a passivation layer arranged in the dielectric layer. The passivation layer comprises a material different from the dielectric layer and an opening between the sensor and the filter.

The method of producing a semiconductor device comprises arranging a sensor at a main surface of a semiconductor substrate, arranging a filter above the sensor, and forming a through-substrate via penetrating the substrate outside the sensor. A semiconductor body is applied above the main surface and then partially removed at least in an area above the sensor. A portion of the semiconductor body remains above the through-substrate via.

In a variant of the method, the semiconductor body is provided with a recess and applied with the recess facing the sensor. The semiconductor body is thinned from a side opposite the substrate, until the recess is reached and the area above the sensor is thus uncovered.

In a further variant of the method, the filter is arranged above the sensor before the semiconductor body is applied, and the semiconductor body is applied with the recess facing the sensor such that the filter is accommodated in the recess.

In a further variant of the method, the filter is arranged above the sensor after the semiconductor body has partially been removed.

In a further variant of the method, a mask is applied after applying and before partially removing the semiconductor body. The mask is open in the area above the sensor and used for partially removing the semiconductor body by etching, the portion remaining above the through-substrate via being covered by the mask.

In a further variant of the method, a sacrificial layer is applied on the portion of the semiconductor body remaining above the through-substrate via, a filter layer is applied on the sacrificial layer and the area above the sensor, and the sacrificial layer is removed together with a portion of the filter layer, so that a remaining portion of the filter layer forms the filter.

The following is a detailed description of examples of the semiconductor device and the production method in conjunction with the appended figures.

DETAILED DESCRIPTION

Figure 1:
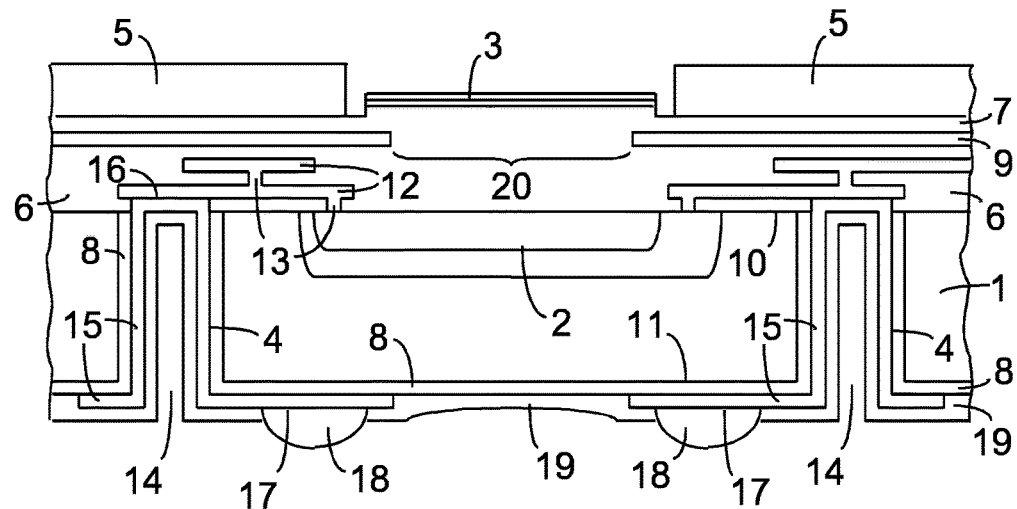
FIG. 1 is a cross section of an embodiment of the semiconductor device.

FIG. 1 is a cross section of an embodiment of the semiconductor device. A semiconductor substrate 1 comprising a main surface 10 and a back side 11 opposite the main surface 10 is penetrated by a through-substrate via 4, which electrically connects a contact area 16 of a metal layer 12, which is arranged above the main surface 10, with a contact pad 17 of a metal layer 15, which is arranged in the via hole 14 and on the back side 11. A sensor 2, especially an optical sensor like a photodetector, is arranged in the substrate 1 at the main surface 10. A filter 3 is arranged above the main surface 10 and above the sensor 2. The filter 3 may be formed by a single layer or by a layer sequence comprising two or more layers of different materials. A layer sequence may especially be provided as an interference filter.

The substrate 1 may further comprise an integrated circuit, especially an integrated circuit for the operation of the sensor 2 and/or for the evaluation of measurements performed with the sensor 2, like a CMOS circuit, for instance. The metal layer 12 may be part of a wiring of the integrated circuit and may be embedded in a dielectric layer 6, 7, which may be silicon dioxide, for instance, and which serves as an intermetal dielectric. The structured metallization layers of the wiring may be interconnected by vertical interconnections 13, which can be formed by metal plugs, for instance.

A passivation layer 9, which comprises a material that is different from the dielectric material of the dielectric layer 6, 7, can be arranged above the metal layers 12 of the wiring, especially between the intermetal dielectric layer 6 and an upper portion of the dielectric layer 7. If the dielectric layer 6, 7 is a silicon oxide, the passivation layer 9 may be a silicon nitride, for instance. The passivation layer 9 is optionally provided with an opening 20 above the sensor 2 to prevent the incident radiation from being adversely affected by the material of the passivation layer 9. In particular, variations of the intensity of the incoming light, which depend on the wavelength and may be caused by the material of the passivation layer 9, are thus avoided.

A frame layer 5, which may be silicon, for example, is arranged on the dielectric layer 6, 7 in a location that is lateral with respect to the filter 3. A small gap may be present between the filter 3 and the frame layer 5. This is indicated in FIG. 1. The frame layer 5 may encompass the filter 3, but this is not necessarily the case. The frame layer 5 may instead be confined to a region above the through-substrate via 4. Thus the thin membrane formed at the bottom of the through-substrate via 4 by the dielectric layer 6, 7 and the metal layer 12 comprising the contact area 16 can be reinforced by the frame layer 5.

On the back side 11, a further dielectric layer 8 may be provided to insulate the metal layer 15 of the through-substrate via 4 from the semiconductor material of the substrate 1. A passivation layer 19, which may comprise a silicon oxide and/or a silicon nitride, for instance, may be provided to cover the back side 11. The passivation layer 19 is open above the contact pads 17, where solder balls 18 or similar contacts may be placed for external electrical connection. The volume of the via hole 14 that is not filled with the metal layer 15 can be left open, or it can be filled with further electrically conductive material and/or with a dielectric material, especially the material of the passivation layer 19.

Figure 2:
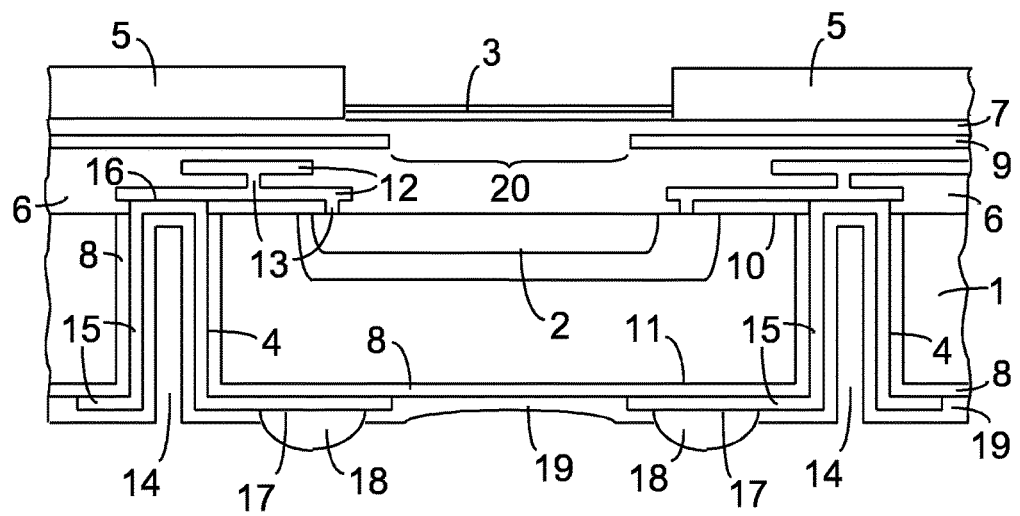
FIG. 2 is a cross section of a further embodiment of the semiconductor device.

FIG. 2 is a cross section of a further embodiment of the semiconductor device. The elements of the embodiment according to FIG. 2 that are similar to corresponding elements of the embodiment according to FIG. 1 are designated with the same reference numerals. The embodiment according to FIG. 2 does not comprise a gap between the filter 3 and the frame layer 5. Furthermore, the filter 3 and the frame layer 5 are arranged on the same plane formed by the upper surface of the dielectric layer 6, 7.

Methods of producing the semiconductor device will be described in the following in conjunction with FIGS. 3 to 10, which show cross sections of intermediate products. The elements that are similar to corresponding elements of the embodiments according to FIGS. 1 and 2 are designated with the same reference numerals.

Figure 3:
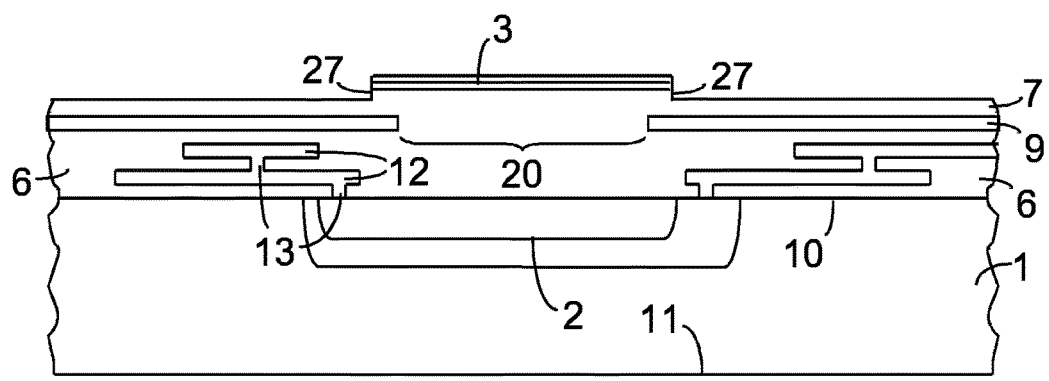
FIG. 3 is a cross section of an intermediate product of a variant of the production method.

FIG. 3 shows a cross section of the semiconductor substrate 1, which may be a CMOS wafer at a stage after processing of the integrated circuitry, for instance. In the desired chip scale package, the CMOS wafer is provided with a plurality of sensors 2 and appertaining integrated circuits, each being provided for a single semiconductor chip. A corresponding plurality of through-substrate vias is produced for an electrical connection of the terminals. The production process will be described in conjunction with one sensor 2, one appertaining filter 3 and a through-substrate via 4 by way of example.

A passivation layer 9, which may comprise silicon nitride, for instance, may be provided on the dielectric layer 6 of the wiring. Such a passivation layer 9 may be opened above the sensor 2, in particular by masked plasma etching, for instance. An additional dielectric layer 7, which may be a silicon oxide, for instance, may be deposited on the passivation layer 9. The surface is then planarized, which may be done by CMP (chemical mechanical polishing), so that a spatial variation of its level above the substrate 1 may only occur within a sufficiently small range of at most 10 nm.

The filter 3, which may be formed by structured interference filter layers, for instance, is applied on the planarized surface above the area of the sensor 2. In particular, the filter 3 can be produced by forming a patterned lift-off mask, which may be a resist, for instance, then sputtering or evaporating suitable filter layers, and subsequently performing a wet-chemical lift-off step to remove the lift-off mask and, together with the mask, the portion of the filter layers that are applied on the lift-off mask. Instead, the filter 3 can be formed by applying an entire layer or layer sequence on the planarized surface and removing the filter layer or layer sequence from areas outside the area above the sensor 2. If the filter layer or layer sequence is etched, the step 27 indicated in FIG. 3 may be formed in the upper dielectric layer 7 at the edge of the filter 3. The step 27 does not adversely affect the performance of the device. If the passivation layer 9 is provided with an appropriate opening 20, only material of the dielectric layer 6, 7 is present between the sensor 2 and the filter 3.

Figure 4:
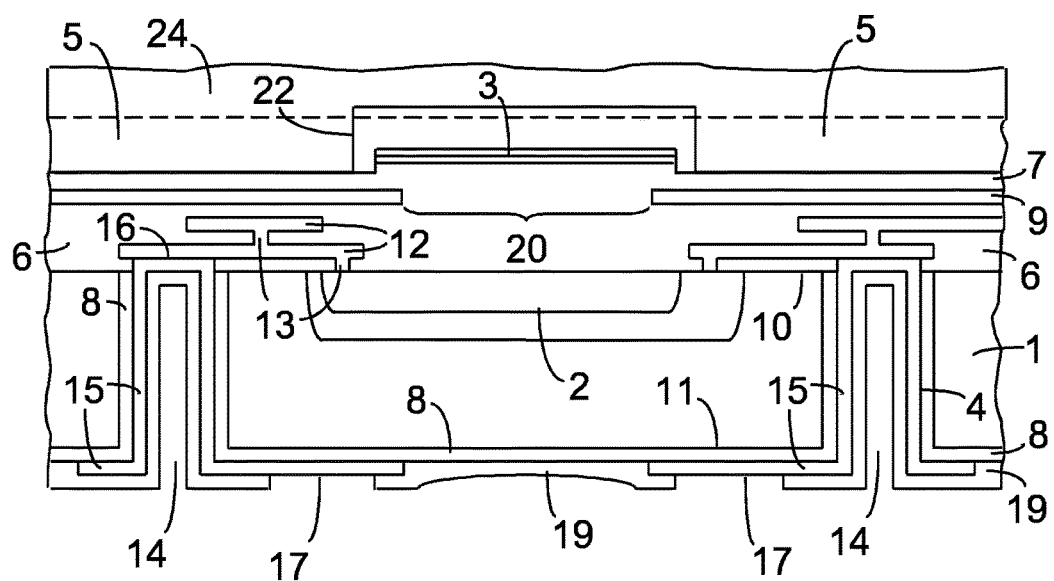
FIG. 4 is a cross section according to FIG. 3 after the formation of through-substrate vias.

FIG. 4 is a cross section according to FIG. 3 for a further intermediate product obtained after the application of a semiconductor body 24 on the upper surface of the dielectric layer 6, 7. The semiconductor body 24 may be silicon, for instance. In this variant of the method, the semiconductor body 24 comprises a recess 22, which can be formed by etching the surface of the semiconductor body 24, for instance. The semiconductor body 24 is arranged with the recess 22 facing the sensor 2, so that the filter 3 is accommodated in the recess 22. The semiconductor body 24 may especially be a structured handling wafer, which is bonded to the CMOS wafer or substrate 1 comprising the sensor 2, and the arrangement may be facilitated by an optical alignment of structured patterns on the surfaces of both wafers. The dielectric layer 6, 7 may serve as a bonding layer. The diameter of the CMOS wafer may be typically about 0.5 mm smaller than the diameter of the handling wafer to ensure that the edge of the CMOS wafer is not damaged during subsequent process steps. The semiconductor body 24 may have a thickness of typically about 725 μm, for example. The recess 22 may have a depth of typically about 40 μm, for example.

The CMOS wafer may be thinned from the back side 11 by grinding and polishing to a thickness of 200 μm or less. The semiconductor body 24 serves as a handling wafer and improves the mechanical stability of the thinned substrate 1 during the subsequent production of the through-substrate via 4.

A suitable process for producing the through-substrate via 4 begins with a formation of structures on the back side 11 in order to aid an alignment with structures already present at the main surface 10. In accordance with these structures, a masked etching step is performed from the back side 11 to produce a via hole 14 penetrating the substrate 1. The dielectric layer 8 can be formed by a deposition of a dielectric material, by an oxidation of the surface of the semiconductor material or by an insulating implantation into the semiconductor material, for example. In particular, a silicon oxide covering the side wall of the via hole 14 may be deposited, and an anisotropic spacer etching step subsequently performed may uncover the contact area 16 at the bottom of the via hole 14 while leaving the side wall of the via hole 14 coated with the oxide.

Then a barrier layer, which may comprise titanium nitride or tantalum nitride, for instance, is deposited on the side wall of the via hole 14, and a metal layer, which may be tungsten, for example, is deposited on the barrier layer. The tungsten layer is then anisotropically etched, so that the side wall of the via hole 14 remains covered with tungsten. A suitable metal like aluminum is then sputtered on the back side 11. An area where the tungsten layer and the aluminum layer overlap ensures a low-ohmic connection between the tungsten and aluminum layers. Thus the metal layer 15 is produced, which comprises a portion located within the via hole 14 and a portion located on the back side 11. The metal layer 15 may instead be formed from one entire layer, which is deposited both inside and outside the via hole 14. The metal layer 15 may be structured on the back side 11, so that contact pads 17 are provided.

The remaining volume of the via hole 14 may be filled with an electrically conductive material like copper or with a dielectric. A passivation layer 19, which may comprise silicon oxide and/or silicon nitride, can be applied and opened above the contact pads 17. In the embodiment shown in FIG. 4, the passivation layer 19 is also applied on the metal layer 15 inside the via hole 14. The process steps forming the through-substrate via 4 can generally be performed according to the prior art cited above.

After the formation of the through-substrate via 4 and the structuring of the metal layer 15 on the back side 11, the semiconductor body 24 is ground from the side opposite the substrate 1. This process step may be facilitated if a grinding foil is laminated above the back side 11, especially on the passivation layer 19. The use of such a foil is known per se, and the foil is not shown in FIG. 4. The semiconductor body 24 is thinned at least until the recess 22 is reached and thus opened without causing damage to the filter 3. The residual thickness of the semiconductor body 24 may be typically about 20 µm, for example. The position of the upper surface of the thinned semiconductor body 24 is indicated in FIG. 3 by the horizontal broken line.

The remaining portion of the semiconductor body 24 forms the frame layer 5, which covers and reinforces a device area including the bottom of the through-substrate via 4. Thereby formation of cracks in the thin membrane formed by the layers remaining above the through-substrate via 4 is reliably prevented. After the application of solder balls on the contact pads 17, the embodiment according to FIG. 1 is obtained.

Figure 5:
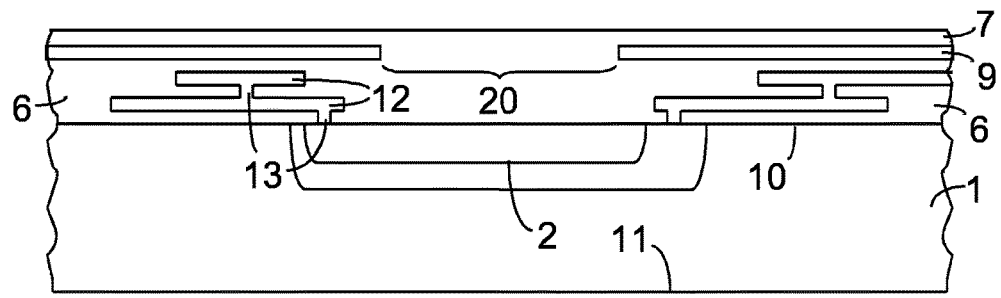
FIG. 5 is a cross section of an intermediate product of a further variant of the production method.

In a further variant of the method, the filter is not formed before the semiconductor body 24 is applied. FIG. 5 is a cross section according to FIG. 3, which represents a process stage at the end of the CMOS process. Corresponding elements are designated with the same reference numerals. In the intermediate product shown in FIG. 5, the planar upper dielectric layer 7 is not yet provided with any filter layer.

Figure 6:
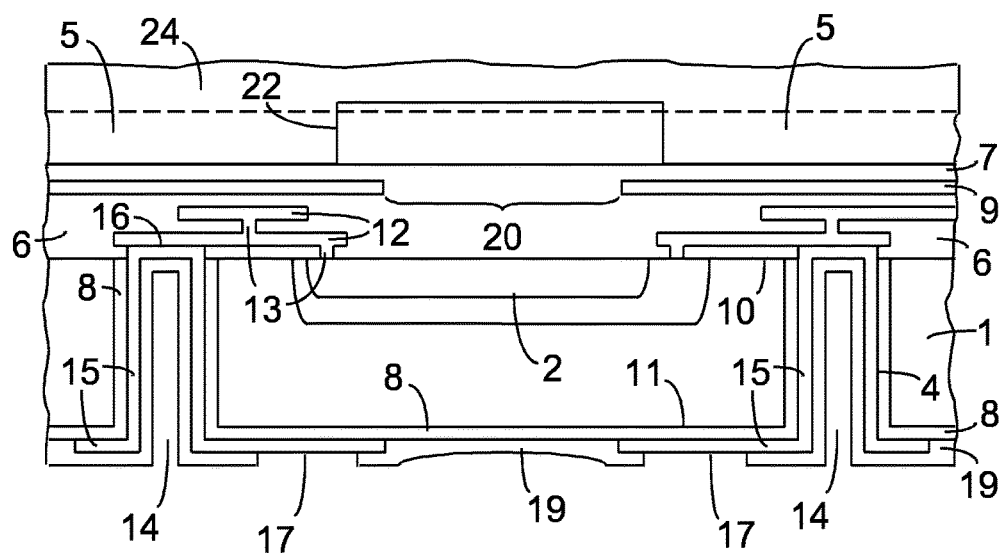
FIG. 6 is a cross section according to FIG. 5 after the formation of through-substrate vias.

FIG. 6 is a cross section according to FIG. 5 for a further intermediate product obtained after the application of a semiconductor body 24, which comprises a recess 22, on the upper surface of the dielectric layer 6, 7. The semiconductor body 24 may be silicon, for instance. As in the variant of the method previously described, the semiconductor body 24 is arranged with the recess 22 facing the sensor 2. The semiconductor body 24 may especially be a structured handling wafer, which is bonded to the CMOS wafer, and the dielectric layer 6, 7 may serve as a bonding layer. The diameter of the CMOS wafer may be typically about 0.5 mm smaller than the diameter of the handling wafer to ensure that the edge of the CMOS wafer is not damaged during subsequent process steps. The semiconductor body 24 may have a thickness of typically about 725 µm, and the recess 22 may have a depth of typically about 40 µm, for example. The thinning of the substrate 1 and the formation of the through-substrate via 4 may then take place as described above. Then the semiconductor body 24 is ground from the side opposite the substrate 1 at least until the recess 22 is reached and opened. The location of the upper surface of the thinned semiconductor body 24 is indicated in FIG. 6 by the horizontal broken line. The remaining portion of the semiconductor body 24 forms the frame layer 5.

Figure 7:
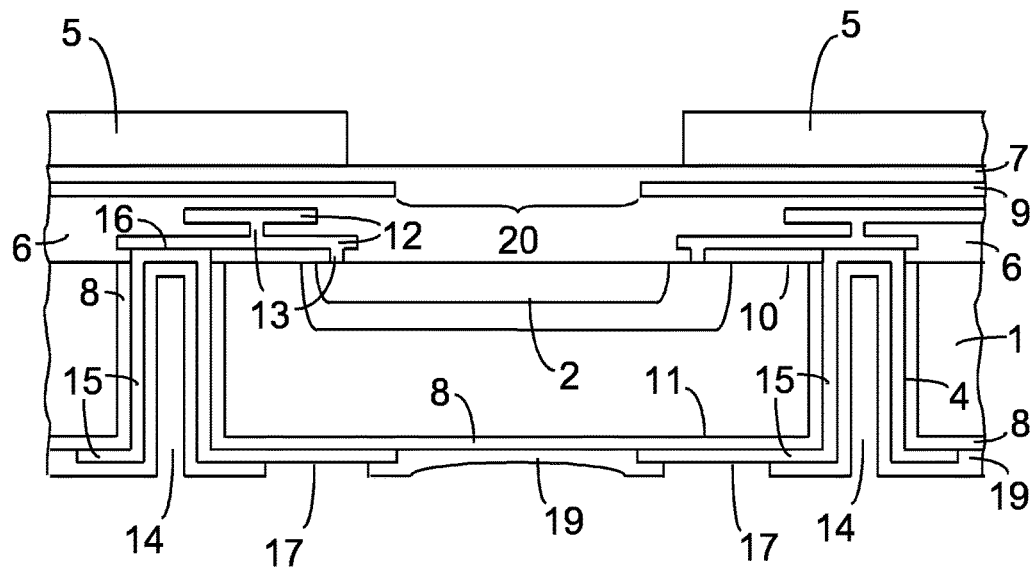
FIG. 7 is a cross section according to FIG. 6 after the frame layer has been formed.

FIG. 7 is a cross section according to FIG. 6 for a further intermediate product obtained after the semiconductor body 24 has been thinned from the side opposite the substrate 1 until the recess 22 is opened and an area of the dielectric layer 7 above the sensor 2 is exposed. The frame layer 5 covers the area of the through-substrate via 4.

Figure 8:
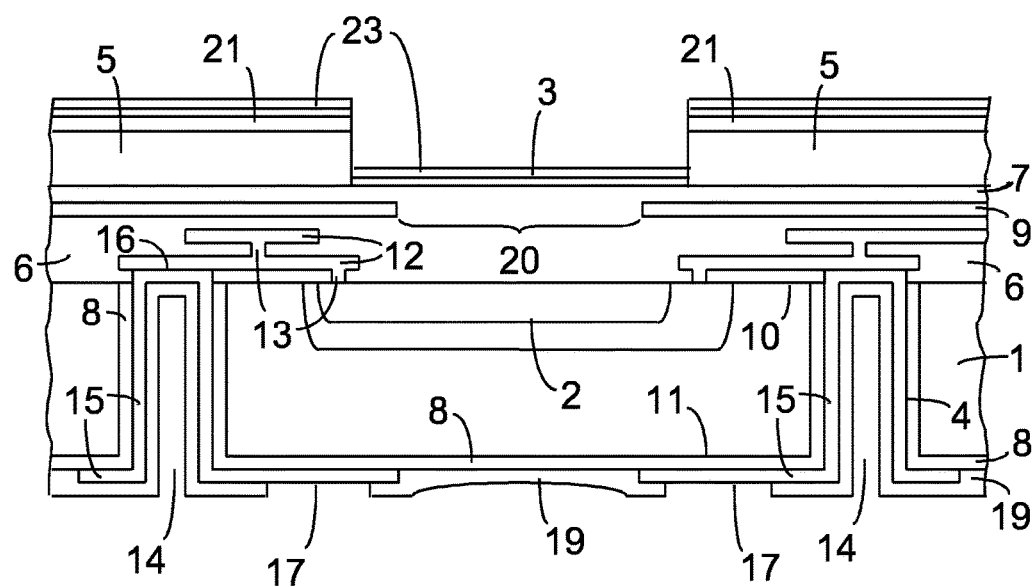
FIG. 8 is a cross section according to FIG. 7 after the application of filter layers.

FIG. 8 is a cross section according to FIG. 7 after the application of a sacrificial layer 21 on the frame layer 5. The sacrificial layer 21 may be a dry film resist, for instance. The sacrificial layer 21 may be confined to the surface of the frame layer 5, but a small overlap of the sacrificial layer 21 into the opening of the frame layer 5 above the sensor 2 does no harm. Then an entire filter layer or sequence of filter layers 23 is applied, especially by sputtering, for example. Because of the step formed by the perimeter of the opening in the frame layer 5 and the restricted conformity of the edge coverage obtained by the sputtering process, the filter layer or sequence of filter layers 23 may not perfectly cover the perimeter of the opening that is present in the frame layer 5. In a subsequent step, the sacrificial layer 21 and the portion of the filter layer or sequence of filter layers 23 that is applied on the sacrificial layer 21 are removed by a lift-off process, in particular by a wet-chemical lift-off process. The remaining portion of the filter layer or sequence of filter layers 23 forms the filter 3 above the sensor 2. After the application of solder balls on the contact pads 17, the embodiment according to FIG. 2 is obtained.

Figure 9:
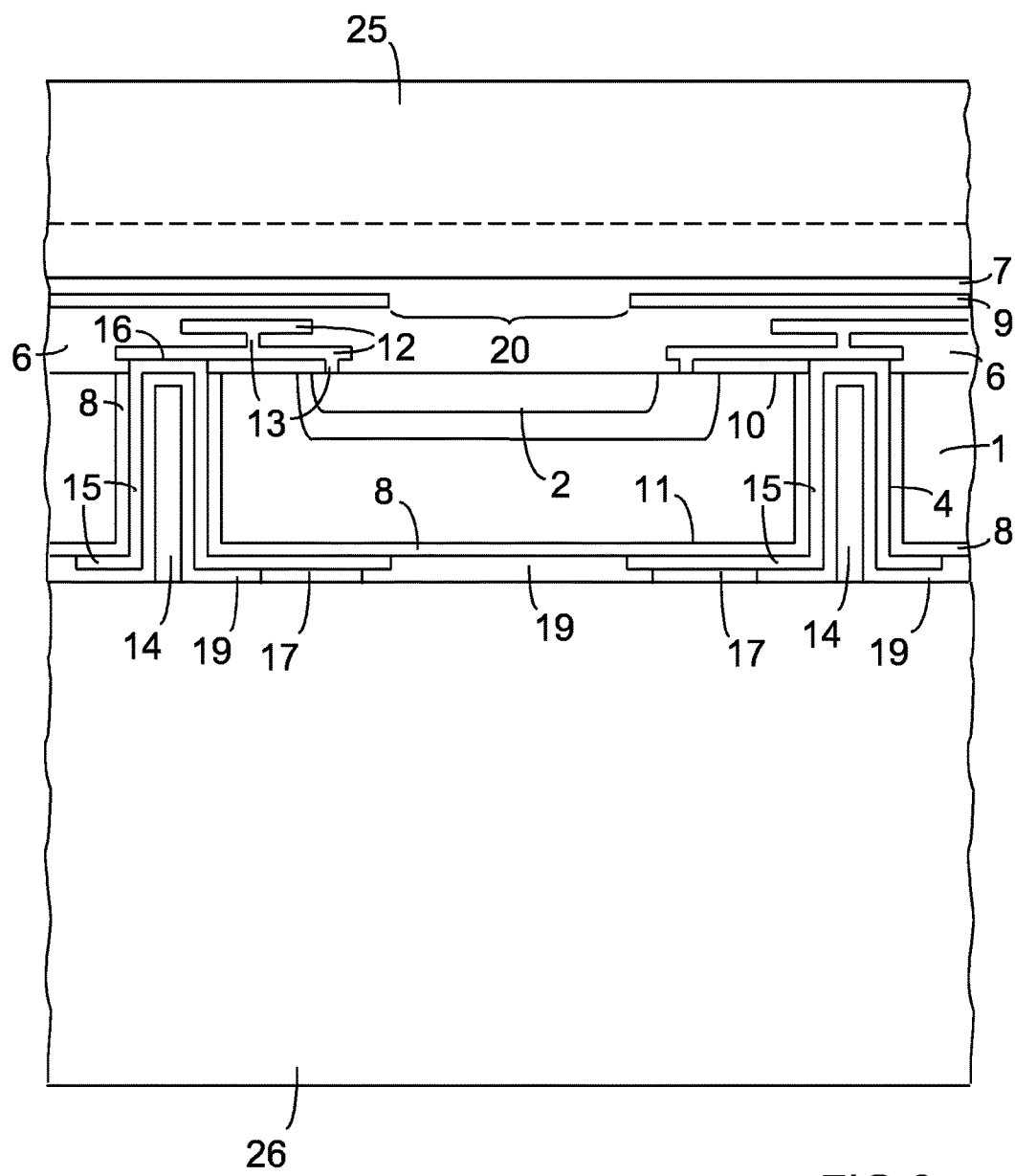
FIG. 9 is a cross section according to FIG. 6 for a further variant of the production method.

FIG. 9 is a cross section according to FIG. 6 for a further variant of the production method using a semiconductor body 25 without recess. The semiconductor body 25 may be an unstructured handling wafer, for instance. After the formation of the through-substrate via 4, the back side 11 of the substrate 1 is temporarily bonded to a handling wafer 26. For this purpose, the passivation layer 19 may be used as a bonding layer, as shown in FIG. 9, or a dedicated bonding layer of silicon oxide, for instance, may be applied. The semiconductor body 25 is ground and polished to a thickness of typically about 20 µm as described above. The location of the upper surface of the thinned semiconductor body 25 is indicated in FIG. 9 by the horizontal broken line.

Figure 10:
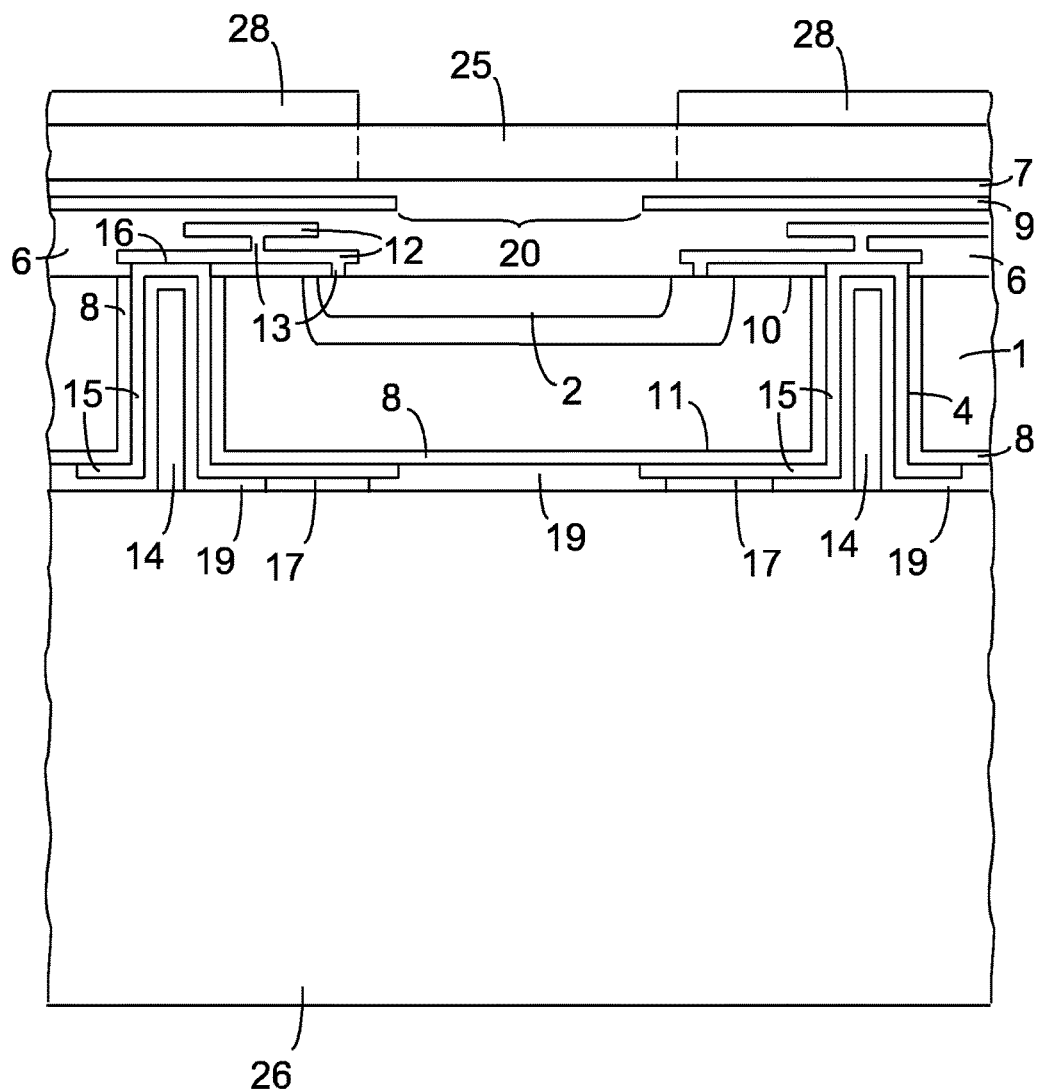
FIG. 10 is a cross section according to FIG. 9 after the application of a mask to form the frame layer.

FIG. 10 is a cross section according to FIG. 9 after the semiconductor body 25 has been thinned. A mask 28 that is open in the area above the sensor 2 is applied on the surface of the remaining portion of the semiconductor body 25. The mask 28 may be a resist, which can be patterned by an infrared alignment step, for example. The mask 28 is then used for partially removing the semiconductor body 25 by etching, in particular by a dry chemical etching step having a high selectivity to the material of the dielectric layer 6, 7, which may be silicon oxide, for example. The portion of the semiconductor body 25 that is covered by the mask 28 remains as the frame layer 5 and covers at least the area above the through-substrate via 4. The mask 28 is removed, so that an intermediate product similar to the one shown in FIG. 7 is obtained. Then the filter 3 is formed by further method steps according to the method steps described above in conjunction with FIG. 8. The handling wafer 26 is removed, and the embodiment according to FIG. 2 is thus obtained.

Further method steps that may be applied similarly for all embodiments described may include coating the contact pads 27 with nickel and gold by an electroless deposition to form an under-bump metallization, and attaching solder balls 18 to the under-bump metallization with a thermal reflow effected subsequently. The sawing of the wafer into single chips can be done with a dual-cut process, for example. The wafer is first sawn from the main surface 10, the CMOS side, without severing the substrate 1, and then completely cut from the back side 11.

The application of the frame layer 5 described provides a highly reliable chip scale package especially for optical applications including interconnections formed by through-substrate vias. The method of producing the semiconductor device is compatible with a standard CMOS process. With this method it is possible to manufacture very thin chip scale packages, whose height is typically smaller than about 270 μm, hence substantially smaller than the height of semiconductor devices for optical applications according to the prior art. This offers considerable advantages in system integration, especially for consumer products. The reliability and mechanical stability of the membranes formed at the bottom of the through-substrate vias are substantially improved.

The invention claimed is:

1. A semiconductor device, comprising:
a semiconductor substrate with a main surface;
a sensor arranged in the substrate at the main surface;
a filter arranged above the sensor;
a through-substrate via penetrating the substrate outside the sensor;
a frame layer arranged above the main surface above the through-substrate via, the frame layer not covering the filter, and the filter being on a level with the frame layer;
a dielectric layer on the main surface, the filter and the frame layer being arranged on the dielectric layer;
a metal layer arranged in the dielectric layer;
a contact area of the metal layer between the through-substrate via and the frame layer;
a further metal layer of the through-substrate via contacting the contact area, the further layer being separated from the frame layer; and
a passivation layer arranged in the dielectric layer, comprising a material different from the dielectric layer, and comprising an opening between the sensor and the filter.

2. The semiconductor device of claim 1, wherein the frame layer is a silicon layer.

3. The semiconductor device of claim 1, wherein the sensor is an optical sensor and the filter is an optical filter.

4. A method of producing a semiconductor device, comprising:
arranging a sensor at a main surface of a semiconductor substrate;
arranging a filter above the sensor;
forming a through-substrate via penetrating the substrate outside the sensor;
applying a semiconductor body above the main surface; and
partially removing the semiconductor body at least in an area above the sensor, a portion of the semiconductor body remaining above the through-substrate via;
providing the semiconductor body with a recess;
applying the semiconductor body with the recess facing the sensor; and
thinning the semiconductor body from a side opposite the substrate until the recess is reached and the area above the sensor is uncovered.

5. The method of claim 4, further comprising:
arranging the filter above the sensor before the semiconductor body is applied; and
applying the semiconductor body with the recess facing the sensor such that the filter is accommodated in the recess.

6. A method of producing a semiconductor device, comprising:
arranging a sensor at a main surface of a semiconductor substrate;
arranging a filter above the sensor;
forming a through-substrate via penetrating the substrate outside the sensor;
applying a semiconductor body above the main surface;
partially removing the semiconductor body at least in an area above the sensor, a portion of the semiconductor body remaining above the through-substrate via, wherein the filter is arranged above the sensor after the semiconductor body has partially been removed;
applying a sacrificial layer on the portion of the semiconductor body remaining above the through-substrate via;
applying a filter layer on the sacrificial layer and the area above the sensor; and
removing the sacrificial layer together with a portion of the filter layer, a remaining portion of the filter layer forming the filter.

7. The method of claim 6, further comprising:
after applying and before partially removing the semiconductor body, applying a mask that is open in the area above the sensor; and
using the mask for partially removing the semiconductor body by etching, the portion remaining above the through-substrate via being covered by the mask.

* * * * *